United States Patent
Jung

(10) Patent No.: US 7,374,868 B2
(45) Date of Patent: May 20, 2008

(54) COMPOSITION FOR AN ORGANIC BOTTOM ANTI-REFLECTIVE COATING AND METHOD FOR FORMING PATTERN USING THE SAME

(75) Inventor: Jae-chang Jung, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 620 days.

(21) Appl. No.: 10/910,063

(22) Filed: Aug. 3, 2004

(65) Prior Publication Data

US 2005/0100818 A1    May 12, 2005

(30) Foreign Application Priority Data

Nov. 6, 2003    (KR)    ........................ 10-2003-0078453

(51) Int. Cl.
*G03C 1/835*    (2006.01)
*G03F 7/30*     (2006.01)
*G03F 7/38*     (2006.01)

(52) U.S. Cl. ................... 430/322; 430/270.1; 430/287; 430/296; 430/330; 430/909; 430/923

(58) Field of Classification Search ................ 430/322, 430/330, 270.1, 287, 923, 909, 296; 252/589
See application file for complete search history.

(56) References Cited

U.S. PATENT DOCUMENTS

| 6,165,684 A | 12/2000 | Mizutani et al. |
| 6,326,669 B1 * | 12/2001 | Hwang et al. .............. 257/384 |
| 6,399,269 B2 | 6/2002 | Mizutani et al. |
| 2006/0153987 A1 * | 7/2006 | Kim et al. .................. 427/282 |

* cited by examiner

*Primary Examiner*—Thorl Chea
(74) *Attorney, Agent, or Firm*—Marshall, Gerstein & Borun LLP

(57) ABSTRACT

Disclosed are a composition for an organic bottom anti-reflective coating able to improve the uniformity of a photoresist pattern with respect to an ultra-fine pattern formation process among processes for manufacturing semiconductor device, which prevents scattered reflection from the bottom film layer and eliminating the standing wave effect due to alteration of the thickness of the photoresist film itself resulting in increase of uniformity of the photoresist pattern. The composition for organic bottom anti-reflective coating is able to reduce amount of polyvinylphenol by introducing a specific light absorbent agent having an etching velocity higher than of the polyvinylphenol, thus notably improving the etching velocity for the organic anti-reflective coating by about 1.5 times, so that and the present composition prevents over-etching of the photoresist to make it possible to conduct a smooth etching process for a layer to be etched.

16 Claims, 1 Drawing Sheet

COMPOSITION FOR AN ORGANIC BOTTOM ANTI-REFLECTIVE COATING AND METHOD FOR FORMING PATTERN USING THE SAME

BACKGROUND OF THE INVENTION

1. Field of the Invention

The present invention relates to a composition for an organic bottom anti-reflective coating able to improve uniformity of a photoresist pattern with respect to an ultra-fine pattern formation process among processes for manufacturing semiconductor device, which prevents scattered reflection from the bottom film layer and eliminating the standing wave effect due to alteration of the thickness of the photoresist film itself resulting in an increase in the uniformity of the photoresist pattern. Particularly, the present invention relates to a composition for organic bottom anti-reflective coating (hereinafter, referred to as "organic anti-reflective coating composition") capable of reducing the amount of polyvinylphenol thus notably improving the etching velocity for the organic anti-reflective coating, and a method for forming a pattern using the same.

2. Description of the Related Art

In semiconductor production processes, an ultra-fine pattern formation process (hereinafter abbreviated as "the patterning method") necessarily involves a standing wave caused by variations of optical properties of a bottom film layer in the photoresist film and/or thickness of the photoresist film; reflective notching status; and variation of critical dimension (hereinafter referred to as CD) of patterns of the photoresist induced by diffracted light and reflected light from the bottom film layer.

Accordingly, it has been proposed an intermediate film, a so-called anti-reflective coating, which is able to prevent diffused light reflection in the bottom film layer prepared by introducing material having higher light absorption abilities in the bandwidth of wavelength for the exposure of a light source and located between the bottom film layer and the photoresist. Such anti-reflective coating is generally divided into an inorganic anti-reflective coating and an organic anti-reflective coating along different materials used.

Particularly, in recent years, the organic anti-reflective coating among the above anti-reflective coatings is applied in the ultra-fine pattern formation process using 193 nm ArF light source and, thus, the organic anti-reflective coating composition and the coating prepared by the same need to satisfy some requirements including:

(1) After lamination of the anti-reflective coating and during a coating of a photoresist film on the top portion thereof, the anti-reflective coating should remain without being dissolved into the solvent for the photoresist. For this, it requires designing the coating to have cross-linkage structures during the lamination process of the anti-reflective coating by coating an anti-reflective coating composition and then performing a baking process and, at the same time, inhibiting generation of other chemical materials as side products.

(2) In order to prevent scattered reflection from bottom film layer, the coating must contain certain materials to absorb light within the wavelength range of the exposure light source.

(3) It needs a catalyst to activate such cross-linking reaction in a process for laminating the anti-reflective coating composition.

(4) No flowing in or out of chemical materials such as acids or amines from the anti-reflective coating. For a positive photoresist, as the acid is transferred from the anti-reflective coating into a photoresist film on portion not to be exposed to the light source (that is, migration), it may cause under-cutting status at bottom portion of the photoresist. Alternatively, if a base such as amine is transferred into the photoresist film, putting phenomenon tends to be derived.

(5) The anti-reflective coating must have an etching velocity relatively higher than the photoresist film on top portion. Such a higher etching velocity allows the etching process to be smoothly conducted on the anti-reflective coating by using the photoresist film as a mask.

(6) Lastly, the anti-reflective coating should have a small thickness as possible, but sufficient to do its inherent role, that is, to serve as the anti-reflective coating.

In order to accomplish the above requirements, conventional organic anti-reflective coating compositions generally comprise a cross-linking agent to allow the anti-reflective coating to have a cross-linkage structure, a light absorbent agent to absorb the light at the wavelength range of exposure from the light source, and a thermal acid generator as a catalyst for activating the cross-linking reaction.

Especially, with respect to the ultra-fine pattern formation process of the photoresist using an ArF light source with a 193 nm wavelength, proposed is a process for producing an organic anti-reflective coating on bottom portion of a photoresist film that uses an organic anti-reflective coating composition usually including polyvinylphenol. Such an organic anti-reflective coating comprising a polyvinylphenol polymer had an etching velocity lower than the photoresist, thus, involved the problem of inducing over-etching of the photoresist making it impossible to conduct the etching process smoothly. Furthermore, since the polyvinylphenol reacts with a development solution used in the process for the formation of a photoresist pattern to generate acid which causes the under-cutting phenomenon on the bottom portion of the photoresist pattern, thus, it may represent a bad pattern such as in a trapezoidal form rather than the desired perpendicular pattern.

Moreover, such a trapezoidal pattern may induce collapse of the pattern and this may happen to the ultra-fine pattern formation process using any light source other than the 193 nm light source, if a specific material such as the polyvinylphenol used as a light absorbent agent.

Accordingly, a strong demand exists for a novel organic anti-reflective coating composition that can replace the polyvinylphenol, which is widely used as the light absorbent agent and/or reduce the amount of polyvinylphenol required, leading to an increase in the etching velocity and decrease in the under-cutting phenomenon caused by reaction between the polyvinylphenol and the development solution, so that it creates an excellent perpendicular pattern and, therefore, prevents collapse of the photoresist pattern.

SUMMARY OF THE INVENTION

The present invention is designed in consideration of the problems of the prior art, and therefore it is an object of the present invention to provide an organic anti-reflective coating composition that can significantly increase the etching velocity for the organic anti-reflective coating and reduce the amount of polyvinylphenol.

Another object of the present invention is to provide a method for forming a pattern using the organic anti-reflective coating composition that can create a superiorperpendicular photoresist pattern and, therefore, protect the pattern from becoming collapsed.

To achieve the above objects, the present invention provides an organic anti-reflective coating composition comprising a cross-linking agent; a light absorbent agent, a photo-acid generator; and an organic solvent, wherein the light absorbent agent comprises polyvinylphenol and further polymer such as poly[1,4-benzene dicarbonyl-alt-bis(4-phenoxyphenyl)methanone] represented by the following formula 1 and having a weight average molecular weight in the range of 5,000 to 50,000.

In another aspect of the present invention, there is provided a method for forming a pattern of the organic anti-reflective coating comprising the steps of: (a) coating the organic anti-reflective coating composition of the present invention on the top portion of a film layer to be etched; (b) conducting the backing process for the obtained material to generating the cross-linkage bond and forming the resultant organic anti-reflective coating; (c) applying a photoresist on the top portion of the organic anti-reflective coating, exposing and developing the photoresist film to produce the desired photoresist pattern; (d) etching the organic anti-reflective coating by using the obtained photoresist pattern as a mask, in turn, the film layer to be etched, thereby forming a pattern on the film layer to be etched.

In a still another aspect of the present invention, there is provided a semiconductor device produced by the patterning process according to the present invention described above.

Hereinafter, the present invention will be described in more detail.

First of all, the light absorbent agent used in the organic anti-reflective coating composition of the present invention comprises further a polymer having an etching velocity higher than polyvinylphenol, in addition to the polyvinylphenol commonly used as the light absorbent agent.

That is, the present invention provides a novel organic anti-reflective coating composition with a reduced amount of the polyvinylphenol resulting in an increase in the etching velocity. With respect to the organic anti-reflective coating composition, the light absorbent agent with the etching velocity higher than of the polyvinylphenol comprise poly[1,4-benzene dicarbonyl-alt-bis(4-phenoxyphenyl)methanone] represented by formula 1 and having a weight average molecular weight in the range of 5,000 to 50,000, commercially available from Aldrich Co., Ltd., with a product code 55088-54-5.

Also, the cross-linking agent used in the present composition includes known cross-linking materials usually applied to conventional organic anti-reflective coating compositions and preferably comprises, but is not limited to, acetal-based compounds for the ultra-fine pattern formation process using an ArF light source. More particularly, poly(3,3-methoxypropen-co-acrolein) having a structure represented by the following formula 2 is preferably applied to the present composition, in which $R_1$, $R_2$ are methyl groups and $R_3$ is hydrogen.

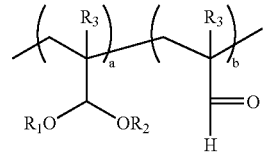

Formula 2 wherein each of $R_1$ and $R_2$ represents alkyl group or allyl group having branch chain or straight chain substituted $C_1$-$C_{10}$; $R_3$ represents hydrogen or methyl group; and a and b represents the mole ratio of the respective monomers of 0.1 to 0.9.

The polymer in formula 2 generally reacts with alcohol in the presence of acid to generate cross-linkage bonds. Thus, by reaction between the above polymer and a polyvinylphenol, such as the light absorbent agent, the cross-linkage bond is generated and inhibits the organic anti-reflective coating from being dissolved in a solvent for the photoresist.

In addition, the polyvinylphenol polymer represented by formula 3 as the other light absorbent agent for the present composition, is well known and obvious to those skilled in art.

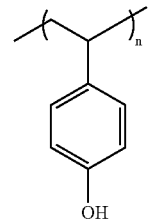

Formula 3

Furthermore, the photo-acid generator used in the organic anti-reflective coating composition of the present invention includes known materials including the photo-acid generator, in particular, preferably comprises 2-hydroxyhexyl p-toluene sulfonate having a structure represented by the following formula 4.

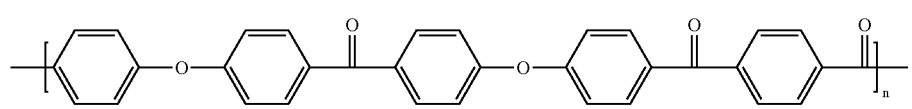

Formula 1

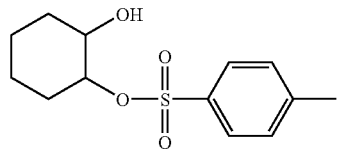

Formula 4

As described above, such a photo-acid generator, is a catalyst to activate cross-linkage reaction that occurs between the cross-linking agent and hydroxyl group in the photo-absorbent agent within the organic anti-reflective coating composition and, generates acid when a thermal process such as a baking process is carried out after applying the organic anti-reflective coating containing the thermal acid generator on a wafer. Sequentially, the cross-linking reaction occurs in the presence of such acid generated to form cross-linkage bonds inside the organic anti-reflective coating, thereby, to produce the organic anti-reflective coating insoluble in the solvent for the photoresist.

An organic anti-reflective coating prepared by dissolving compounds with formulae 2 to 4 in propyleneglycol methylether acetate (PGMEA) solvent was already disclosed in document Polymer 41(2000), 6691 to 6694. However, the organic anti-reflective coating of the present invention comprising the polymer represented by the formula 1 which is introduced as the light absorbent agent exhibited the etching velocity about 1.5 times higher than the existing organic anti-reflective coating disclosed above.

In addition, the organic anti-reflective coating composition of the present invention further comprises an acid-diffusion inhibitor, in which the acid-diffusion inhibitor prevents the acid generated from the reaction between the development solution and the polyvinylphenol polymer used as the light absorbent agent from being dispersed toward the lower portion of the photoresist pattern, in turn, the under-cutting phenomenon for the photoresist pattern and, therefore, can form an excellent perpendicular photoresist pattern and protect the pattern from being collapsed.

Herein, the acid-diffusion inhibitor may preferably comprise a crown ether based compound, more preferably, 18-crown-6(1,4,7,10,13,16-hexaoxacyclooctadecane) having a structure represented by the following formula 5.

Formula 5

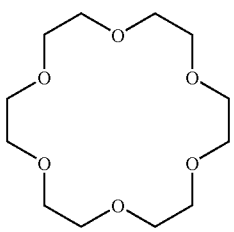

With respect to the organic anti-reflective coating composition according to the present invention, the cross-linking polymer with the formula 2 may be preferably contained in an amount of 50 to 400% by weight relative to amount of the polymer with the formula 1, while the polyvinylphenol may be preferably contained in an amount of 20 to 500% by weight relative to the amount of the polymer with the formula 1 among the composition. Also, the thermal acid generator with the formula 4 is preferably contained in an amount of 10 to 200% by weight relative to the amount of the polymer with the formula 1 among the composition. Likewise, the organic solvent may be preferably in the range of 1,000 to 10,000% by weight with respect to the total amount of the polymers represented by formulas 1, 2 and 3. While, the acid-diffusion inhibitor may be preferably contained in an amount of 30 to 500% by mole with respect to the amount of the photo-acid generator included in the present composition.

Since the present composition comprises respective components listed above in such specified ratios, it can efficiently prevent scattered reflection from the bottom film layer of the photoresist and, at the same time, the under-cutting phenomenon on the bottom portion of the photoresist so that the present invention achieves an excellent perpendicular pattern.

In another aspect of the present invention, there is provided a method for forming photoresist pattern comprising the steps of: (a) coating the organic anti-reflective coating composition of the present invention on top portion of a film layer to be etched; (b) conducting the backing process for the obtained material to generate the cross-linkage bond and forming the resultant organic anti-reflective coating; (c) applying a photoresist on top portion of the organic anti-reflective coating, exposing and developing the photoresist film to produce the desired photoresist pattern; (d) etching the organic anti-reflective coating by using the obtained photoresist pattern as a mask, in turn, the film layer to be etched, thereby forming a pattern on the film layer to be etched.

By such a patterning method according to the present invention, the organic-scattered reflective coating composition comprising the polymer with the formula 1 having a higher etching velocity which is introduced as the light absorbent agent, is characterized in that it exhibits a remarkably high etching velocity for the organic-scattered reflection coating and reduces the amount of polyvinylphenol used, thereby reducing generation of acid due to the reaction between the development solution and the polyvinylphenol in the patterning process. Accordingly, it is possible to prevent the under-cutting phenomenon on the bottom portion of the photoresist, therefore, obtaining an excellent perpendicular photoresist pattern.

In the patterning process of the present invention, the baking process is preferably performed at 150 to 300° C. for 1 to 5 minutes. By conducting the baking process under the above conditions, the photo-acid generator generates acid to form cross-linkage bonds in the organic anti-reflective coating, in turn, to form the organic anti-reflective coating insoluble to a solvent for the photoresist.

Additionally, the patterning process of the present invention further comprises an additional baking process before or after the exposure process among the steps mentioned above to form the pattern, which is preferably conducted at 70 to 200° C.

Although the anti-reflective coating composition and the patterning process according to the present invention are mostly adapted to ultra-fine pattern formation processes using an ArF light source, they can be also applied to other ultra-fine pattern formation processes using KrF, DUV including EUV, E-beam, X-ray or ionic beams.

In still another aspect of the present invention, there is provided a semiconductor device produced by the patterning process according to the present invention described above.

BRIEF DESCRIPTION OF THE DRAWINGS

Other objects and aspects of the present invention will become apparent from the following description of examples with reference to the accompanying drawing in which.

DESCRIPTION OF THE PREFERRED EMBODIMENT

EXAMPLES

Figure 1:
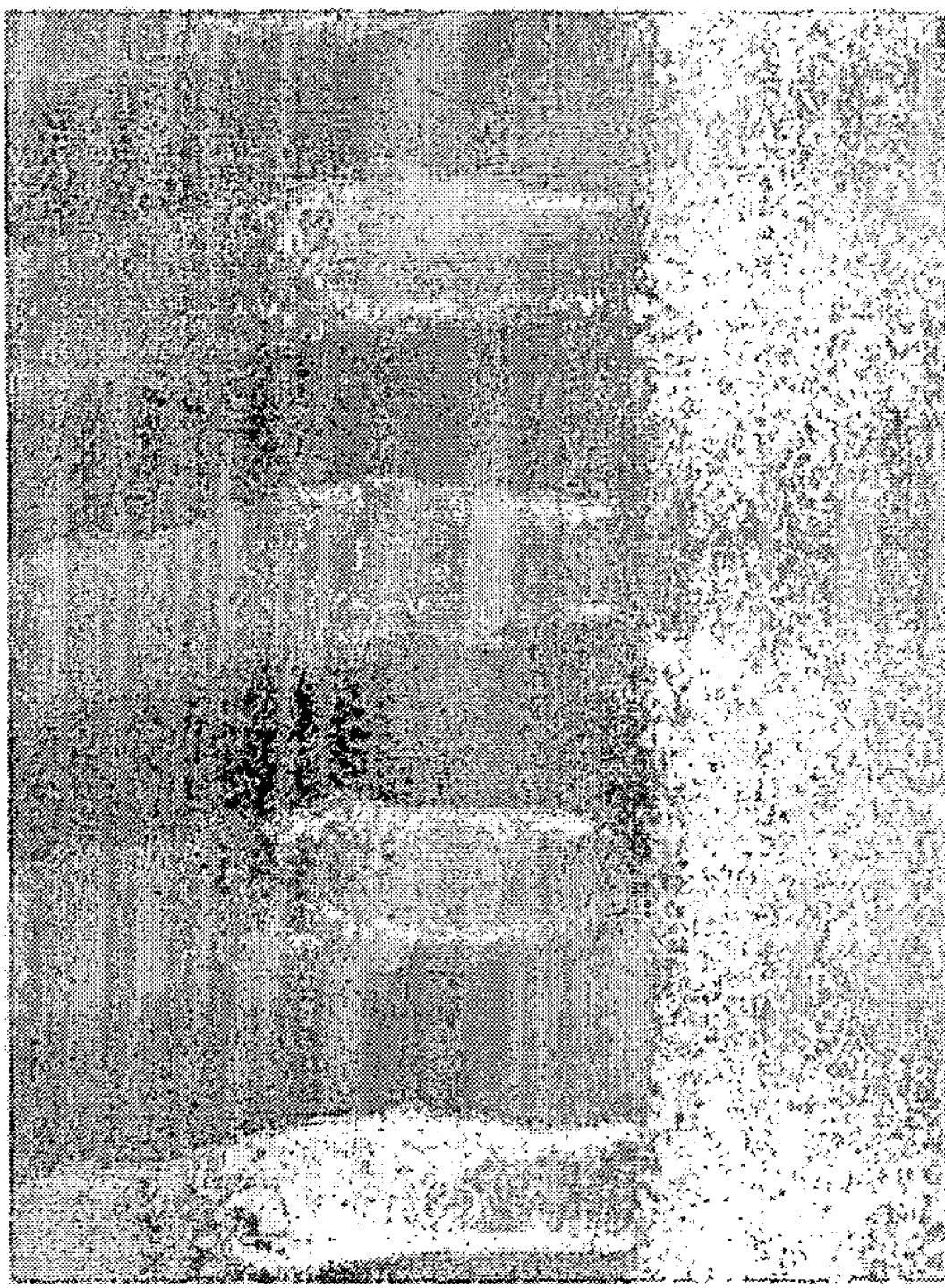
FIG. 1 is a photograph illustrating a cross-section of a real 100 nm L/S photoresist pattern when applied an organic-scattered reflective coating prepared by using an organic-scattered reflective coating composition according to the present invention.

The present invention is now described in further detail with reference to the following examples, which are only illustrative and are not intended to limit the scope of the invention in any way.

Comparative Example

Preparation of organic anti-reflective coating composition and organic anti-reflective coating by conventional technique 0.4 g of the cross-linking agent represented by the above formula 2 (wherein $R_1$ and $R_2$ are methyl groups and $R_3$ is hydrogen), 0.6 g of the light absorbent agent represented by the above formula 3 and 0.085 g of the photo-acid generator represented by the above formula 4 were dissolved together in 10 g of propyleneglycol methylether acetate. The solution obtained was filtered through a fine filter having 0.2 μm pore size to produce the conventional organic anti-reflective coating composition. On a silicone wafer, such a organic anti-reflective coating composition was spin-coated at 3000 rpm, then, under the baking process at 240° C. for 90 seconds to generate cross-linkage bonds and to form the organic anti-reflective coating.

Example 1

Preparation of organic anti-reflective coating composition and organic anti-reflective coating by the present invention.

0.4 g of the cross-linking agent with the above formula 2, 0.4 g of the light absorbent agent with the above formula 1, 0.2 g of the light absorbent agent with the above formula 3 and 0.85 g of the photo-acid generator with the above formula 4 were dissolved together in 10 g of cyclohexanone solvent. The solution obtained was filtered through a fine filter having 0.2 μm pore size to produce the present organic anti-reflective coating composition. On a silicone wafer, such produced organic anti-reflective coating composition was spin-coated at 3000 rpm, then, put under a baking process at 240° C. for 90 seconds to generate cross-linkage bonds and to form the organic anti-reflective coating.

Example 2

Comparison Test of Etching Velocity

Thickness of the organic anti-reflective coatings obtained from Comparative Example 1 and Example 1, were listed in Table 1.

TABLE 1

|  | Thickness before etching | Thickness after etching | Thickness to be etched |
| --- | --- | --- | --- |
| Comparative Example 1 | 2690 Å | 1367 Å | 1323 Å |
| Example 1 | 2697 Å | 845 Å | 1852 Å |

In this example, the etching gas was a mixture of $CF_4$, $O_2$ and Ar.

As shown in the above Table 1, the present organic anti-reflective coating composition in Example 1 can accomplish the etching velocity about 1.4 times faster than that of the existing composition in Comparative Example 1.

Example 3

Pattern Improvement Test

On a wafer already formed with the organic anti-reflective coating as in Example 1, a photoresist DHA 150 manufactured by Dong-Jin SemiChem Co., Ltd. for 193 nm wavelength was coated in a thickness of 0.24 μm, then treated by a baking process at 120° C. for 90 seconds. After conducting the baking process, an exposure process was carried out by an ArF scanner (NA=0.63) of ASML Co., Ltd. and followed by a further post-baking process at 120° C. for 90 seconds. After completion of the baking process, the baked product was put under a development process with 2.38% by weight of tetramethylammonium hydroxide (TMAH) solution to be developed to obtain a final photoresist pattern. The photoresist pattern formed by the above method was illustrated in FIG. 1.

It was found that the organic anti-reflective coating prepared in Example 1 can provide the perpendicular pattern.

As described above, the present invention can improve the etching velocity about 1.5 times over conventional organic anti-reflective coating by introducing a specific light absorbent agent having an etching velocity higher than polyvinylphenol, so that it enhances etching selectivity and achieves a smooth etching process by using the photoresist film as a mask during the etching process.

Furthermore, by reducing the amount of polyvinylphenol to be used, the present invention can reduce the undercutting phenomenon possibly induced by using the polyvinylphenol and modify a bad pattern such as trapezoidal pattern into the desirable perpendicular pattern.

Especially, when the present organic anti-reflective coating is applied to the ultra-fine pattern formation process using 193 nm ArF as the exposure light source, it can efficiently reduce reflected light from the bottom film layer, in turn, the standing wave effect.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An organic anti-reflective coating composition comprising a cross-linking agent, a light absorbent agent, a photo-acid generator, and an organic solvent,
   wherein the light absorbent agent comprises a polyvinylphenol in combination with a poly [1,4-benzene dicarboyl-alt-bis(4-phenoxyphenyl)methanonel] having a weight average molecular weight in the range of 5,000-50,000.

2. The composition according to claim 1, wherein the cross-linking agent comprises a polymer represented by the following formula 2:

Formula 2

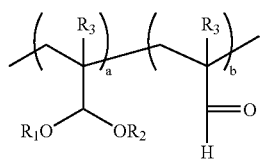

Formula 2 wherein each of $R_1$ and $R_2$ represents an alkyl group or an allyl group having a branched chain or straight chain substituted $C_1$-$C_{10}$; $R_3$ represents hydrogen or methyl group; and a and b represent the mole ratio of the respective monomers of 0.1 to 0.9.

3. The composition according to claim 1, wherein the photo-acid generator comprises a compound having a structure represented by the following formula 4

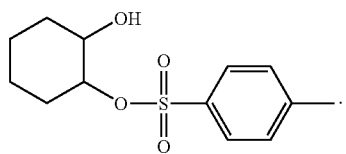

Formula 4

4. The composition according to claim 1, wherein the composition further comprises an acid-diffusion inhibitor.

5. The composition according to claim 4, wherein the acid-diffusion inhibitor comprises a crown ether based compound.

6. The composition according to claim 5, wherein the acid-diffusion inhibitor comprises 18-crown-6(1,4,7,10,13,16-hexaoxacyclooctadecane) represented by formula 5

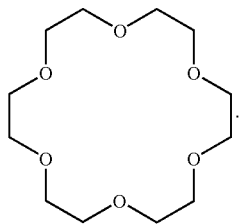

Formula 5

7. The composition according to claim 1, wherein the cross-linking agent is contained in an amount of 50 to 400% by weight relative to the amount of the poly [1,4-benzene dicarboyl-alt-bis(4-phenoxyphenyl)methanone].

8. The composition according to claim 1, wherein the polyvinylphenol is contained in an amount of 20 to 500% by weight relative to the amount of the poly [1,4-benzene dicarboyl-alt-bis(4-phenoxyphenyl)methanone].

9. The composition according to claim 1, wherein the photo-acid generator is contained in an amount of 10 to 200% by weight relative to the amount of the poly [1,4-benzene dicarboyl-alt-bis(4-phenoxyphenyl)methanone].

10. The composition according to claim 1, wherein the organic solvent is contained in an amount of 1,000 to 10,000% by weight relative to the total amount of the polymer represented by formula 2, poly [1,4-benzene dicarboyl-alt-bis(4-phenoxyphenyl)methanonel], and polyvinylphenol.

11. The composition according to claim 4, wherein the acid-diffusion inhibitor is contained in an amount of 30 to 500% by mole relative to the amount of the photo-acid generator.

12. A method for forming a photoresist pattern comprising:
(a) coating the organic anti-reflective coating composition according to claim 1 on a top portion of a film layer to be etched;
(b) conducting a baking process for the obtained material to generate the a cross-linkage bond and to form a resultant organic anti-reflective coating;
(c) applying a photoresist film on a top portion of the organic anti-reflective coating, exposing and developing the photoresist film to produce a desired photoresist pattern; and
(d) etching the organic anti-reflective coating by using the obtained photoresist pattern as an etching mask and, in turn, the film layer to be etched, thereby forming a pattern on the film layer to be etched.

13. The method according to claim 12, comprising performing the baking process at 150° C. to 300° C. for 1 minutes to 5 minutes.

14. The method according to claim 12, further comprising performing an additional baking process before or after exposing the photoresist film.

15. The method according to claim 14, comprising performing the additional baking process at 70° C. to 200° C.

16. The method according to claim 12, wherein the method is applied to an ultra-fine pattern formation process using ArF, KrF, DUV, EUV, E-beam, X-ray, or ionic beam.

* * * * *